(12) United States Patent
Aoi

(10) Patent No.: US 6,903,006 B2
(45) Date of Patent: Jun. 7, 2005

(54) INTERLAYER DIELECTRIC FILM, AND METHOD FOR FORMING THE SAME AND INTERCONNECTION

(75) Inventor: Nobuo Aoi, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 28 days.

(21) Appl. No.: 09/809,043

(22) Filed: Mar. 16, 2001

(65) Prior Publication Data

US 2002/0034873 A1 Mar. 21, 2002

(30) Foreign Application Priority Data

Mar. 17, 2000 (JP) ........................................ 2000-075130

(51) Int. Cl.[7] ........................................... H01L 21/4763
(52) U.S. Cl. ...................... 438/627; 428/209; 428/458
(58) Field of Search ......................... 438/627; 428/209, 428/210, 458

(56) References Cited

U.S. PATENT DOCUMENTS

| | | | |
|---|---|---|---|
| 5,141,817 A | * | 8/1992 | Babich et al. .............. 428/447 |
| 5,955,528 A | * | 9/1999 | Sato et al. .................. 524/413 |
| 5,962,113 A | * | 10/1999 | Brown et al. ............... 428/209 |
| 6,162,838 A | * | 12/2000 | Kohl ............................ 521/77 |
| 6,319,854 B1 | * | 11/2001 | Aoi ............................. 438/781 |
| 6,380,346 B1 | * | 4/2002 | Han ........................... 528/210 |

FOREIGN PATENT DOCUMENTS

| | | |
|---|---|---|
| JP | 11-214382 | 8/1999 |
| JP | 200-077399 | 3/2000 |
| JP | 2000-080272 | 3/2000 |

* cited by examiner

*Primary Examiner*—George Fourson
*Assistant Examiner*—Fernando L. Toledo
(74) *Attorney, Agent, or Firm*—Nixon Peabody LLP; Donald R. Studebaker

(57) ABSTRACT

The interlayer dielectric film made of a three-dimensionally polymerized polymer is formed by polymerizing: first cross-linking molecules having three or more sets of functional groups in one molecule providing a three-dimensional structure; and a second cross-linking molecule having two sets of functional groups in one molecule providing a two-dimensional structure. In the three-dimensionally polymerized polymer, dispersed are a number of molecular level pores formed by the polymerization of the first and second cross-linking molecules.

14 Claims, 13 Drawing Sheets

FIRST CROSSLINKING MOLECULAR
(THREE DIMENSIONS STRUCTURE)

SECOND CROSSLINKING MOLECULAR
(TWO DIMENSIONS STRUCTURE)

UNIT

UNIT

1-Bromoadamantane

↓ AlCl₃

1,3,5,7-tetraphenyladamantane

↓ I₂

1,3,5,7-tetrakis(4-iodophenyl)adamantane 1,3,5,7-tetrakis(4-iodophenyl)adamantane $CO_2$ | sec-ButylLi 1,3,5,7-tetrakis(4-carboxylatophenyl)adamantane 1,3,5,7-tetrakis(4-carboxylatophenyl)adamantane

FIRST
CROSSLINKING
MOLECULAR (THREE DIMENSIONS
STRUCTURE)

SECOND
CROSSLINKING
MOLECULAR (TWO DIMENSIONS
STRUCTURE)

UNIT

INTERLAYER DIELECTRIC FILM, AND METHOD FOR FORMING THE SAME AND INTERCONNECTION

BACKGROUND OF THE INVENTION

The present invention relates to an interlayer dielectric film that is low in relative dielectric constant and good in mechanical strength, thermal resistance, and adhesion to a substrate, a method for forming such an interlayer dielectric film, and a method for forming an interconnection on an interlayer dielectric film.

As organic polymer films usable as the interlayer dielectric film of VLSI, known are polymer films formed by polymerizing aromatic molecules, which exhibit good thermal resistance, polymer films made of polyimide derivatives, polymer films made of polyallylether derivatives, polymer films made of polyquinoline derivatives, polymer films made of polyparaxylene derivatives, and the like.

The above organic polymer films, which contain carbon as a main component, are low in polarizability of component molecules and thus low in relative dielectric constant, compared with silicon oxide films that have been conventionally used as the interlayer dielectric film of VLSI. Due to this feature, polymer films have received attention as interlayer dielectric films having a low relative dielectric constant.

The relative dielectric constant of an organic polymer film containing carbon as a main component is about 2.4 to about 3.0, which is lower than that of a silicon oxide film that is about 3.3 to about 4.5. As an exception, however, among the silicon oxide films there is known a kind of organic SOG film containing an organic component that has a relative dielectric constant of about 2.9.

In recent years, further reduction in the relative dielectric constant of the interlayer dielectric film has been desired, and for this purpose, porous interlayer dielectric films have been examined.

When an interlayer dielectric film is porous, the relative dielectric constant of the film is low. However, a porous interlayer dielectric film has a new problem that the mechanical strength, the thermal resistance, and the adhesion to a substrate of the interlayer dielectric film are lowered.

The above problem arises due to the structural defect of the conventional porous interlayer dielectric film that it is obtained by reducing the density of cross-linking of an organic polymer. This structural defect will be discussed as follows.

The mechanical strength of an organic polymer film is greater as the density of cross-linking of the film is higher. However, the conventional organic polymer film is made porous by cutting cross-linked sites of the organic polymer, resulting in partially cutting the network of molecules by which the mechanical strength of the organic polymer film is maintained. This inevitably lowers the mechanical strength. The interlayer dielectric film having a reduced mechanical strength causes a problem of destroying an interconnection structure when the interlayer dielectric film is flattened by chemical mechanical polishing (CMP).

The cutting of cross-linked sites of the organic polymer also causes the following problem. An interlayer dielectric film made of such an organic polymer film becomes softened when it is subjected to heat treatment at a later stage. This causes deformation or destruction of a multi-layer interconnection structure.

In addition, the cutting of cross-linked sites of the organic polymer also cuts cross-linked sites between the organic polymer film and a substrate. This results in reducing the adhesion of the interlayer dielectric film to the substrate.

Moreover, in the conventional porous organic polymer film, statistical variation in the size (size distribution) of pores in the film is unavoidable and the dispersion of the pores is not uniform. Accordingly, the resultant interlayer dielectric film is no more uniform in quality, and thus fails to respond to the demand for finer VLSI.

If VLSI is made finer while using the conventional porous organic polymer film, there will inevitably exist pores having a size close to a design rule. Existence of such pores will cause a problem of pattern defect.

Furthermore, a number of pores are formed continuously in the conventional porous organic polymer film. This unavoidably causes a trouble of water, etching gas, a cleaning solution, or the like entering the interlayer dielectric film, thereby deteriorating the quality of the film.

SUMMARY OF THE INVENTION

The first object of the present invention is providing an interlayer dielectric film, in which the mechanical strength, the heat resistance, and the adhesion to a substrate are improved by forming a porous organic polymer film without cutting cross-linked sites of an organic polymer, and which includes non-continuous pores having a size of molecular level dispersed uniformly, so as to respond to the demand for finer VLSI and also prevent deterioration of the film quality during the fabrication process. The second object of the present invention is providing a method for forming an interconnection on such an interlayer dielectric film without deteriorating the characteristics of the interlayer dielectric film.

In order to attain the first object described above, the interlayer dielectric film of the present invention is made of a three-dimensionally polymerized polymer having a number of molecular level pores inside, formed by polymerizing first cross-linking molecules having a three-dimensional structure and second cross-linking molecules having a two-dimensional structure.

In the interlayer dielectric film of the present invention, molecular level pores are formed in the three-dimensionally polymerized polymer formed by polymerizing first cross-linking molecules having a three-dimensional structure and second cross-linking molecules having a two-dimensional structure. This permits formation of a number of pores without the necessity of cutting cross-linked sites as in the conventional porous film. In addition, it is possible to uniformly disperse non-continuous pores having a size of molecular level.

As a result, the interlayer dielectric film of the present invention is good in mechanical strength, heat resistance, and adhesion to a substrate, can respond to the demand for finer VLSI, and is free from deterioration of the film quality during the fabrication process.

In the interlayer dielectric film of the present invention, preferably, the first cross-linking molecules are first organic molecules having three or more sets of functional groups in one molecule, the second cross-linking molecules are second organic molecules having two sets of functional groups in one molecule, and the three-dimensionally polymerized polymer is formed by binding the three or more sets of functional groups of each of the first organic molecules and the two sets of functional groups of each of the second organic molecules together.

The above construction ensures the formation of the three-dimensionally polymerized polymer having a number of molecular level pores inside.

In the interlayer dielectric film of the present invention, preferably, the first organic molecules are represented by

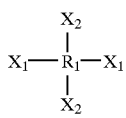

[chemical formula 1]

(where $R_1$ is a first organic skeleton, $X_1$ is a first set of functional groups, and $X_2$ is a second set of functional groups, $X_1$ and $X_2$ being same or different in type), the second organic molecules are represented by

[chemical formula 2]

(where $R_2$ is a second organic skeleton, $Y_1$ is a third set of functional groups and $Y_2$ is a fourth set of functional groups, $Y_1$ and $Y_2$ being same or different in type), the three-dimensionally polymerized polymer is formed by binding the first set of functional groups ($X_1$) and the third set of functional groups ($Y_1$) together and binding the second set of functional groups ($X_2$) and the fourth set of functional groups ($Y_2$) together, and the molecular level pores are formed in regions surrounded by the first organic skeletons ($R_1$) and the second organic skeletons ($R_2$).

The above construction ensures the formation of molecular level pores in regions surrounded by the first organic skeletons of the first cross-linking molecules and the second organic skeletons of the second cross-linking molecules in the three-dimensionally polymerized polymer.

In the interlayer dielectric film of the present invention, preferably, the first organic molecules are represented by

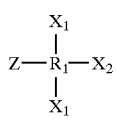

[chemical formula 3]

(where $R_1$ is a first organic skeleton, $X_1$ is a first set of functional groups, $X_2$ is a second set of functional groups, and Z is a third set of functional groups, $X_1$ and $X_2$ being same or different in type), the second organic molecule is represented by

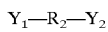

[chemical formula 4]

(where $R_2$ is a second organic skeleton, $Y_1$ is a fourth set of functional groups, and $Y_2$ is a fifth set of functional groups, $Y_1$ and $Y_2$ being same or different in type), the three-dimensionally polymerized polymer is formed by first binding the first set of functional groups ($X_1$) and the fourth set of functional groups ($Y_1$) together and binding the second set of functional groups ($X_2$) and the fifth set of functional groups ($Y_2$) together to form a plurality of units and then binding the third sets of functional groups (Z) of the plurality of units together, and the molecular level pores are formed in regions surrounded by the first organic skeletons ($R_1$) and the second organic skeletons ($R_2$) in the plurality of units.

With the above construction, molecular level pores can be formed in regions surrounded by the first organic skeletons of the first cross-linking molecules and the second organic skeletons of the second cross-linking molecules in respective units. The units are bound together to form the three-dimensionally polymerized polymer. Therefore, in the resultant three-dimensionally polymerized polymer, a number of molecular level pores are dispersed.

In order to attain the first object described above, the method for forming an interlayer dielectric film of the present invention includes the step of polymerizing first cross-linking molecules having a three-dimensional structure and second cross-linking molecules having a two-dimensional structure to form an interlayer dielectric film comprising a three-dimensionally polymerized polymer having a number of molecular level pores.

In the method for forming an interlayer dielectric film of the present invention, molecular level pores are formed in the three-dimensionally polymerized polymer formed by polymerizing first cross-linking molecules having a three-dimensional structure and second cross-linking molecules having a two-dimensional structure. This permits formation of a number of pores without the necessity of cutting cross-linked sites as in the conventional porous film. In addition, it is possible to uniformly disperse non-continuous pores having a size of molecular level.

As a result, the method for forming an interlayer dielectric film of the present invention enables formation of an interlayer dielectric film that is good in mechanical strength, heat resistance, and adhesion to a substrate, can respond to the demand for finer VLSI, and is free from deterioration of the film quality during the fabrication process.

In the method for forming an interlayer dielectric film of the present invention, preferably, the first cross-linking molecules are first organic molecules having three or more sets of functional groups in one molecule, the second cross-linking molecules are second organic molecules having two sets of functional groups in one molecule, and the three-dimensionally polymerized polymer is formed by binding the three or more sets of functional groups of each of the first organic molecules and the two sets of functional groups of each of the second organic molecules together.

The above method ensures the formation of the three-dimensionally polymerized polymer having a number of molecular level pores inside.

In the method for forming an interlayer dielectric film of the present invention, preferably, the first organic molecules are represented by

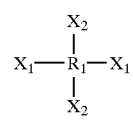

[chemical formula 1]

(where $R_1$ is a first organic skeleton, $X_1$ is a first set of functional groups, and $X_2$ is a second set of functional groups, $X_1$ and $X_2$ being same or different in type), the second organic molecules are represented by

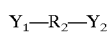

[chemcial formula 2]

(where $R_2$ is a second organic skeleton, $Y_1$ is a third set of functional groups, and $Y_2$ is a fourth set of functional groups, $Y_1$ and $Y_2$ being same or different in type), the three-dimensionally polymerized polymer is formed by binding the first set of functional groups ($X_1$) and the third set of functional groups ($Y_1$) together and binding the second set of functional groups ($X_2$) and the fourth set of functional groups ($Y_2$) together, and The molecular level pores are formed in regions surrounded by the first organic skeletons ($R_1$) and the second organic skeletons ($R_2$).

The above method ensures the formation of molecular level pores in regions surrounded by the first organic skeletons of the first cross-linking molecules and the second organic skeletons of the second cross-linking molecules in the three-dimensionally polymerized polymer.

In the method for forming an interlayer dielectric film of the present invention, preferably, the first organic molecules are represented by

[chemical formula 3]

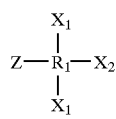

(where $R_1$ is a first organic skeleton, $X_1$ is a first set of functional groups, $X_2$ is a second set of functional groups, and Z is a third set of functional groups, $X_1$ and $X_2$ being same or different in type), the second organic molecules are represented by

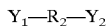

[chemical formula 4]

(where $R_2$ is a second organic skeleton, $Y_1$ is a fourth set of functional groups, and $Y_2$ is a fifth set of functional groups, $Y_1$ and $Y_2$ being same or different in type), the three-dimensionally polymerized polymer is formed by first binding the first set of functional groups ($X_1$) and the fourth set of functional groups ($Y_1$) together and binding the second set of functional groups ($X_2$) and the fifth set of functional groups ($Y_2$) together to form a plurality of units and then binding the third sets of functional groups (Z) of the plurality of units together, and the molecular level pores are formed in regions surrounded by the first organic skeletons ($R_1$) and the second organic skeletons ($R_2$) in the plurality of units.

With the above method, molecular level pores can be formed in regions surrounded by the first organic skeletons of the first cross-linking molecules and the second organic skeletons of the second cross-linking molecules in respective units. The units are bound together to form the three-dimensionally polymerized polymer. Therefore, in the resultant three-dimensionally polymerized polymer, a number of molecular level pores are dispersed.

In order to attain the second object described above, the method for forming an interconnection of the present invention includes the steps of: forming an interlayer dielectric film comprising a three-dimensionally polymerized polymer having a number of molecular level pores inside, by polymerizing first cross-linking molecules having a three-dimensional structure and second cross-linking molecules having a two-dimensional structure; forming a surface barrier film on the interlayer dielectric film; forming a mask on the surface barrier film; forming an concave portion in the surface barrier film and the interlayer dielectric film by etching the surface barrier film and the interlayer dielectric film using the mask; and forming an interconnection made of a metal material by filling the concave portion with the metal material.

According to the first method for forming an interconnection of the present invention, the surface barrier film is first formed on the interlayer dielectric film and then a mask is formed on the surface barrier film. Accordingly, in the step of forming a film to be used as the mask, it is possible to avoid the possibility of a material gas entering the pores in the interlayer dielectric film, and thus prevent increase of the relative dielectric constant of the interlayer dielectric film. Therefore, the size of the pores of the interlayer dielectric film can be made so large as to otherwise allow the material gas to enter the pores. In this way, the relative dielectric constant of the interlayer dielectric film can be greatly reduced.

In order to attain the second object described above, the method for forming an interconnection of the present invention includes the steps of: forming an interlayer dielectric film comprising a three-dimensionally polymerized polymer having a number of molecular level pores inside, by polymerizing first cross-linking molecules having a three-dimensional structure and second cross-linking molecules having a two-dimensional structure; forming a mask on the interlayer dielectric film; forming an concave portion in the interlayer dielectric film by etching the interlayer dielectric film using the mask; forming a sidewall barrier film on sidewalls of the concave portion; and forming an interconnection made of a metal material by filling the concave portion having the sidewall barrier film with the metal material.

According to the second method for forming an interconnection of the present invention, the sidewall barrier film is first formed on the sidewalls of the concave portion and then the concave portion is filled with a metal material to form the interconnection. Accordingly, in the step of forming a metal film to be used as the interconnection, it is possible to avoid the possibility of a gas of the metal material entering the pores in the interlayer dielectric film, and thus prevent increase of the relative dielectric constant of the interlayer dielectric film. Therefore, the size of the pores of the interlayer dielectric film can be made so large as to otherwise allow the metal material gas to enter the pores. In this way, the relative dielectric constant of the interlayer dielectric film can be greatly reduced.

The second method for forming an interconnection of the present invention may further include the step of forming a surface barrier film on the interlayer dielectric film between the step of forming an interlayer dielectric film and the step of forming a mask, wherein the step of forming an concave portion comprises the step of forming a concave portion in the surface barrier layer and the interlayer dielectric film by etching the surface barrier film and the interlayer dielectric film using the mask. By the above method, it is possible to avoid the possibility of the material gas entering the pores in the interlayer dielectric film, and thus prevent increase of the relative dielectric constant of the interlayer dielectric film more reliably.

In the first or second method for forming an interconnection of the present invention, preferably, the first cross-linking molecules are first organic molecules having three or more sets of functional groups in one molecule, the second cross-linking molecules are second organic molecules having two sets of functional groups in one molecule, and the three-dimensionally polymerized polymer is formed by binding the three or more sets of functional groups of each of the first organic molecules and the two sets of functional groups of each of the second organic molecules together.

The above method ensures the formation of the interlayer dielectric film made of a three-dimensionally polymerized polymer having a number of molecular level pores inside.

In the first or second method for forming an interconnection of the present invention, preferably, the first organic molecules are represented by

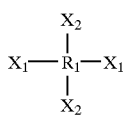

[chemical formula 1]

(where $R_1$ is a first organic skeleton, $X_1$ is a first set of functional groups, and $X_2$ is a second set of functional groups, $X_1$ and $X_2$ being same or different in type), the second organic molecules are represented by

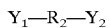 [chemical formula 2]

(where $R_2$ is a second organic skeleton, $Y_1$ is a third set of functional groups, and $Y_2$ is a fourth set of functional groups, $Y_1$ and $Y_2$ being same or different in type), The three-dimensionally polymerized polymer is formed by binding the first set of functional groups ($X_1$) and the third set of functional groups ($Y_1$) together and binding the second set of functional groups ($X_2$) and the fourth set of functional groups ($Y_2$) together, and The molecular level pores are formed in region surrounded by the first organic skeletons ($R_1$) and the second organic skeletons ($R_2$).

The above method ensures the formation of a number of molecular level pores in regions surrounded by the first organic skeletons of the first cross-linking molecules and the second organic skeletons of the second cross-linking molecules in the three-dimensionally polymerized polymer constituting the interlayer dielectric film.

In the first or second method for forming an interconnection of the present invention, preferably, the first organic molecules are represented by

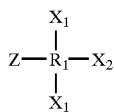

[chemical formula 3]

(where $R_1$ is a first organic skeleton, $X_1$ is a first set of functional groups, $X_2$ is a second set of functional groups, and Z is a third set of functional groups, $X_1$ and $X_2$ being same or different in type), the second organic molecules are represented by

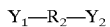 [chemical formula 4]

(where $R_2$ is a second organic skeleton, $Y_1$ is a fourth set of functional groups, and $Y_2$ is a fifth set of functional groups, $Y_1$ and $Y_2$ being same or different in type), the three-dimensionally polymerized polymer is formed by first binding the first set of functional groups ($X_1$) and the fourth set of functional groups ($Y_1$) together and binding the second set of functional groups ($X_2$) and the fifth set of functional groups ($Y_2$) together to form a plurality of units and then binding the third sets of functional groups (Z) of the plurality of units together, and the molecular level pores are formed in regions surrounded by the first organic skeletons ($R_1$) and the second organic skeletons ($R_2$) in the plurality of units.

With the above method, molecular level pores can be formed in regions surrounded by the first organic skeletons of the first cross-linking molecules and the second organic skeletons of the second cross-linking molecules in respective units of the three-dimensionally polymerized polymer constituting the interlayer dielectric film. The units are bound together to form the three-dimensionally polymerized polymer. Therefore, in the resultant three-dimensionally polymerized polymer, a number of molecular level pores are dispersed.

DESCRIPTION OF THE PREFERRED EMBODIMENTS (First Embodiment)

Hereinafter, the interlayer dielectric film and the method for forming the same of the first embodiment of the present invention will be described with reference to FIGS. 1A and 1B.

Figure 1A:
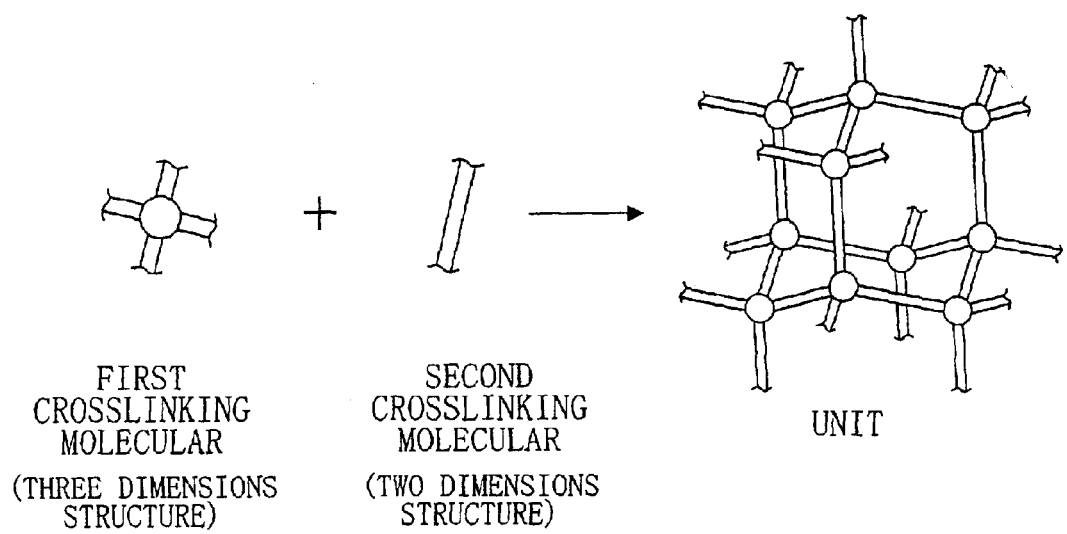
FIGS. 1A and 1B are conceptual views illustrating a method for forming an interlayer dielectric film of the first embodiment.
Figure 1B:
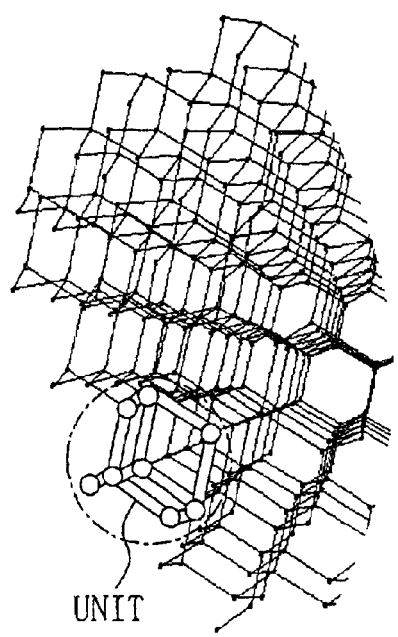

In the first embodiment, as shown in FIG. 1A, one unit is composed of 10 first cross-linking molecules each having four sets of functional groups providing a three-dimensional structure and 12 second cross-linking molecules (linear cross-linking molecules) each having two sets of functional groups providing a two-dimensional structure. Chemical bond is established between the four sets of functional groups of each first cross-linking molecule and the two sets of functional groups of each second cross-linking molecule, to form the unit in which three hexagons share two sides with one another.

The set of functional groups as used herein refers to a position composed of one functional group or a plurality of functional groups at which one molecule can be bound with another molecule, where the number of functional groups in chemical terms does not matter. For example, two carboxyl groups (functional groups) are bound with one amino group (functional group) to form one imide ring. Since two carboxyl groups and one amino group form one bonding site, the two carboxyl groups and the one amino group respectively constitute one set of functional groups.

A number of units each having the structure shown in FIG. 1A are polymerized to form a three-dimensionally polymerized polymer having a diamond structure. Such a three-dimensionally polymerized polymer constitutes an interlayer dielectric film. In FIG. 1B, the portion surrounded by the one-dot chain line represents the unit shown in FIG. 1A.

In the first embodiment, a number of pores are formed inside the three-dimensionally polymerized polymer. The interlayer dielectric film therefore has a number of pores inside, and thus the relative dielectric constant thereof is low.

In the first embodiment, the units each formed by the chemical bond between the first cross-linking molecules and the second cross-linking molecules are polymerized to form the three-dimensionally polymerized polymer that includes a number of pores therein. Therefore, it is not necessary to cut cross-linked sites as in the conventional porous film to form a number of pores. The resultant interlayer dielectric film of the first embodiment is high in density of cross-linking compared with the conventional porous film, and thus superior in mechanical strength, thermal resistance, and adhesion to a substrate to the conventional porous film.

EXAMPLE 1

An example of the interlayer dielectric film and the formation method thereof of the first embodiment will be described with reference to FIGS. 2A, 2B, and 3.

Figure 2A:
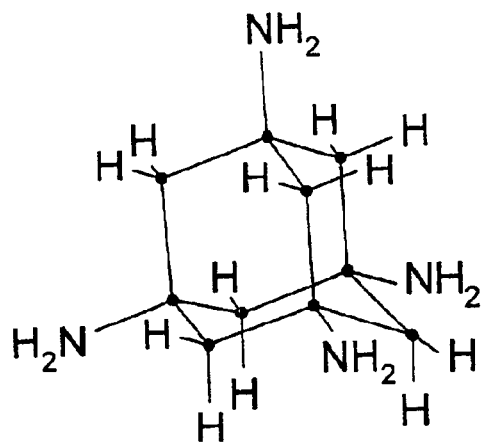
FIG. 2A is a view illustrating a structure of a first cross-linking molecule used in Example 1 of the method for forming an interlayer dielectric film of the first embodiment.
Figure 2B:
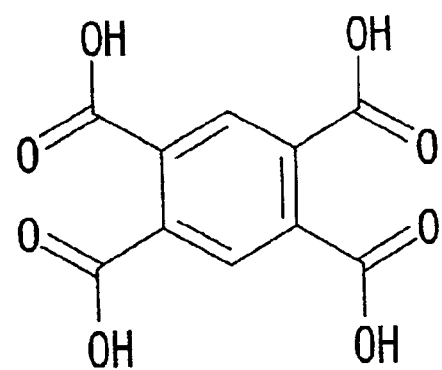
FIG. 2B is a view illustrating a structure of a second cross-linking molecule used in Example 1 of the method for forming an interlayer dielectric film of the first embodiment.

First, an adamantane derivative having four amino groups (hereinafter, referred to as a tetraaminoadamantane derivative) as shown in FIG. 2A is used as the first cross-linking molecule having four sets of functional groups. A benzenetetracarboxylic acid derivative as shown in FIG. 2B is used as the second cross-linking molecule having two sets of functional groups.

The tetraaminoadamantane derivative (first cross-linking molecule) and the benzenetetracarboxylic acid derivative (second cross-linking molecule) are dissolved and mixed at a mole fraction of 1:2 in N-methylpyrrolidone (NMP). The resultant mixed solution has a solid content of about 15% by weight.

The mixed solution is stirred at room temperature for about 30 minutes, and then 5 ml of the mixed solution is applied to a silicon substrate during rotation at a rotational speed of 4000 rpm to form an applied film on the silicon substrate. The applied film is dried on a hot plate at a temperature of 250° C., and then heat-treated in a nitrogen atmosphere at a temperature of 400° C. for 30 minutes to sinter the applied film and thereby form an interlayer dielectric film having a thickness of 400 nm.

The tetraaminoadamantane derivative and the benzenetetracarboxylic acid derivative can solve in the solution of N-methylpyrrolidone since they form polyamic acid in the solution.

Figure 3:
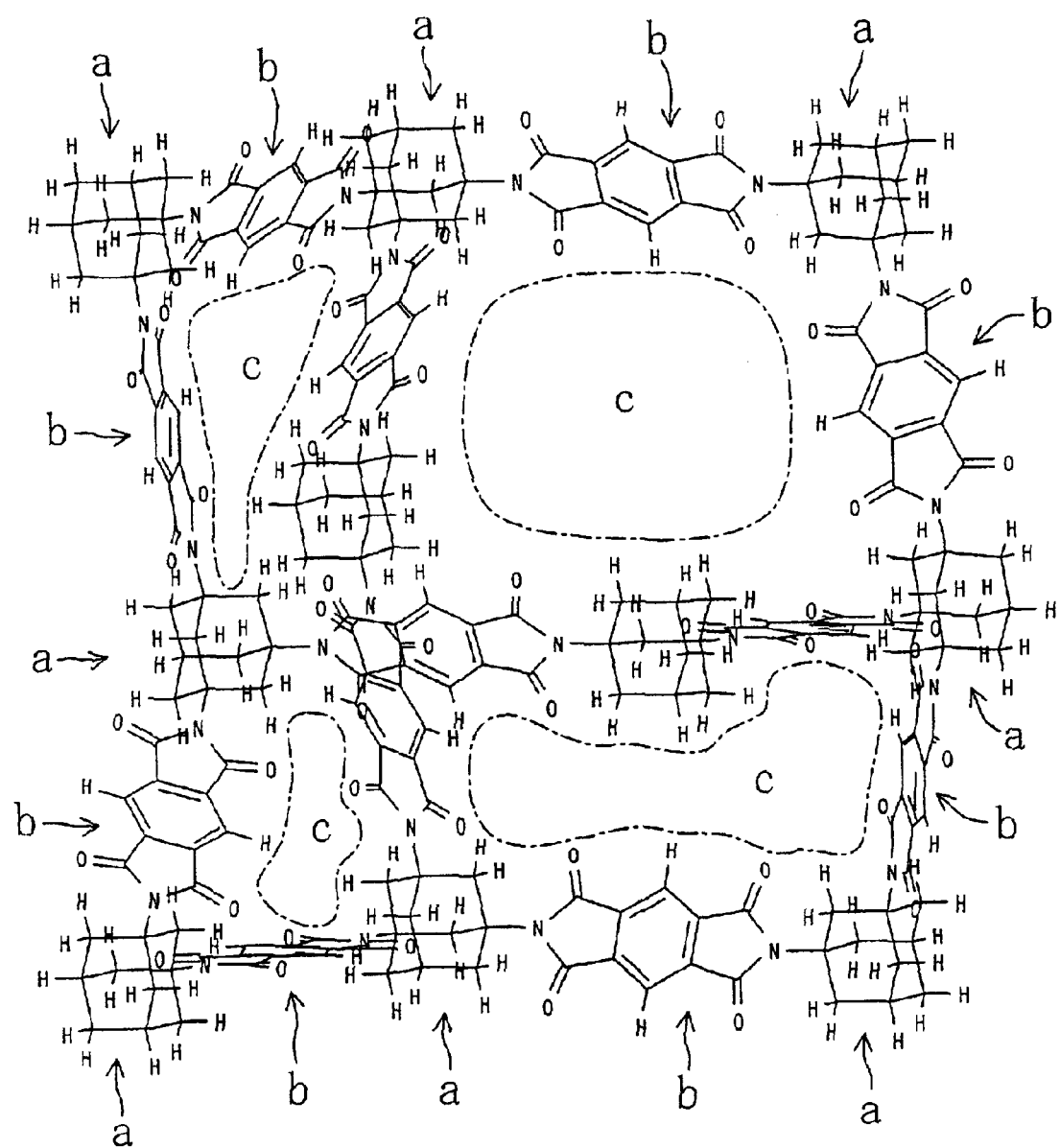
FIG. 3 is a view illustrating a structure of a three-dimensionally polymerized polymer formed in Example 1 of the method for forming an interlayer dielectric film of the first embodiment.

During the heat treatment for the applied film, 10 tetraaminoadamantane derivatives and 12 benzenetetracarboxylic acid derivatives are polymerized together to form a network polymerized polymer film having a diamond structure (basket-like polymerized polymer film) as shown in FIG. 3, which has a number of pores c inside. In FIG. 3, the symbol a indicates the tetraaminoadamantane derivatives, b indicates the benzenetetracarboxylic acid derivatives, and c indicates the molecular level pores.

In Example 1, the pores c have a molecular level size and are dispersed uniformly in the network polymerized polymer film. Therefore, the resultant interlayer dielectric film has a significantly low relative dielectric constant.

In addition, since the network polymerized polymer film has a diamond structure, the interlayer dielectric film has a large mechanical strength.

The capacitance of the interlayer dielectric film was measured by a CV method using a mercury prober, and the relative dielectric constant was calculated from the thickness of the interlayer dielectric film. As a result, the relative dielectric constant was 1.8.

The relative dielectric constant of the interlayer dielectric film, which varies with changes of the mixed ratio of the tetraaminoadamantane derivatives to the benzenetetracarboxylic acid derivatives, is minimum when the tetraaminoadamantane derivatives and the benzenetetracarboxylic acid derivatives are mixed at a mole fraction of 1:2.

In Example 1, the imide formation reaction between an amino group and a carboxylic group was employed as the polymerization reaction between the first and second cross-linking molecules. The reaction is not limited to the above, but reaction systems such as amide bond reaction, ether bond reaction, C—C bond reaction, and C—N bond reaction may be employed.

EXAMPLE 2

Another example of the interlayer dielectric film and the formation method thereof of the first embodiment will be described with reference to FIGS. 4A to 4C, 5A, 5B, 6A, 6B, and 7.

First, a process of synthesizing the first cross-linking molecule having four functional groups will be described.

Figure 4A:
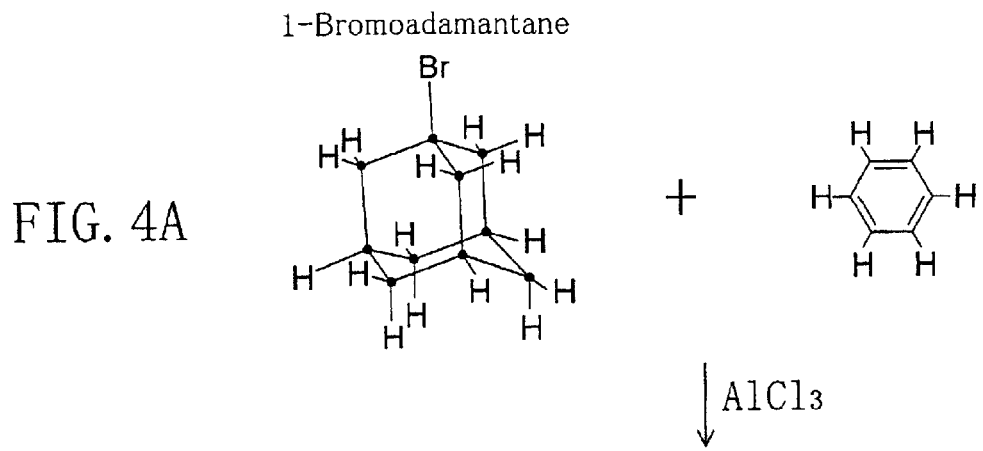
FIGS. 4A through 4C are views illustrating chemical reaction for synthesizing a first cross-linking molecule used in Example 2 of the method for forming an interlayer dielectric film of the first embodiment.
Figure 4B:
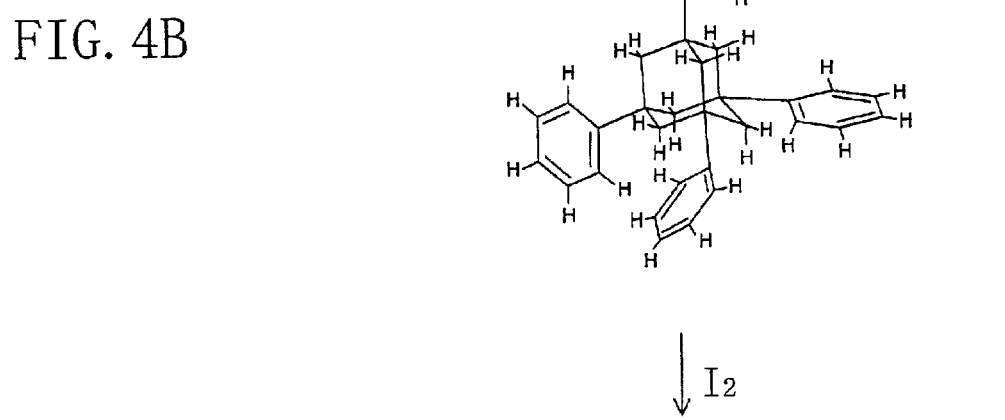
Figure 4C:
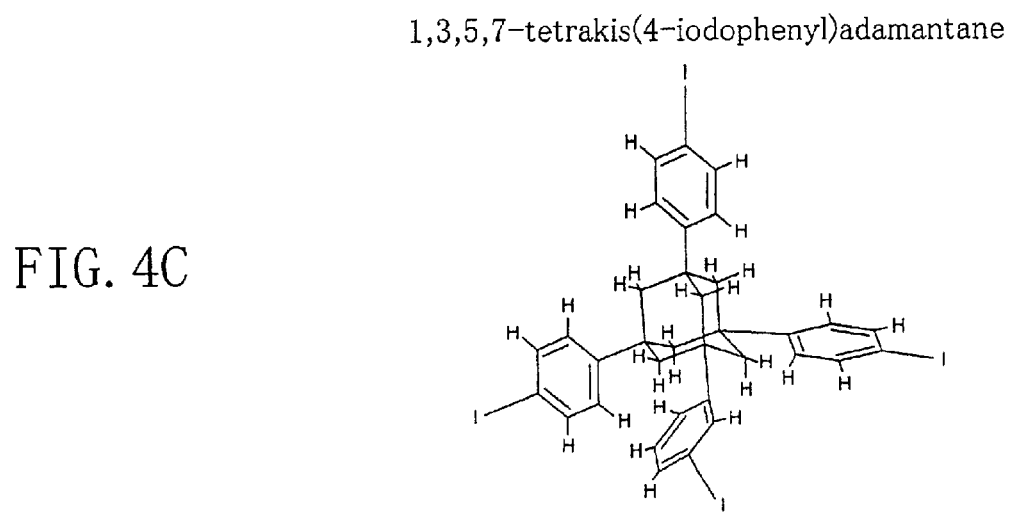

As shown in FIG. 4A, 1-bromoadamantane and benzene are allowed to react with each other using $AlCl_3$ as a catalyst to form 1,3,5,7-tetraphenyladamantane. Thereafter, as shown in FIG. 4B, the para-position of the phenyl group of the 1,3,5,7-tetraphenyladamantane is iodized to form 1,3,5,7-tetrakis(4-iodophenyl)adamantine shown in FIG. 4C.

Figure 5A:
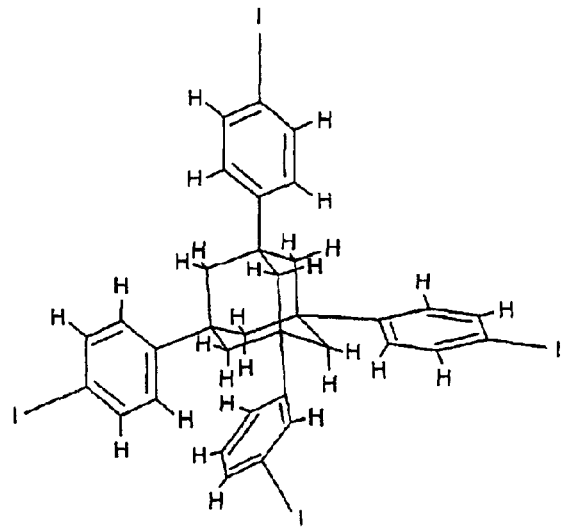
FIGS. 5A and 5B are views illustrating the chemical reaction for synthesizing the first cross-linking molecule used in Example 2 of the method for forming an interlayer dielectric film of the first embodiment.
Figure 5B:
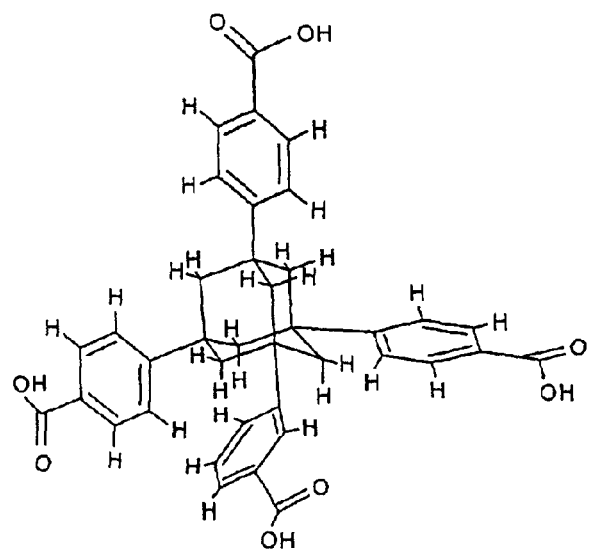

As shown in FIGS. 5A and 5B, the 1,3,5,7-tetrakis(4-iodophenyl)adamantine is allowed to react using secbutyl-lithium as a catalyst in the presence of $CO_2$ supplied by bubbling for carboxylation, to form 1,3,5,7-tetrakis(4-carboxylatophenyl)adamantine (first cross-linking molecule).

Figure 6A:
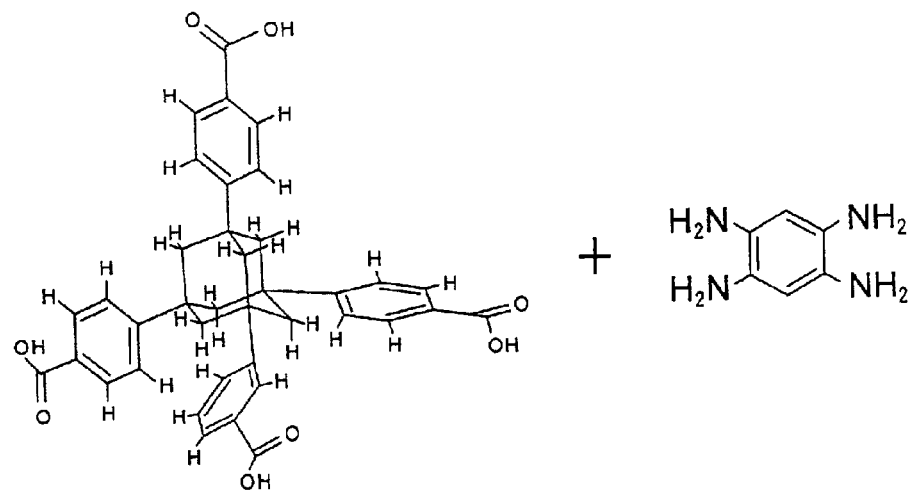
FIGS. 6A and 6B are views illustrating copolymerization reaction in Example 2 of the method for forming an interlayer dielectric film of the first embodiment.
Figure 6B:
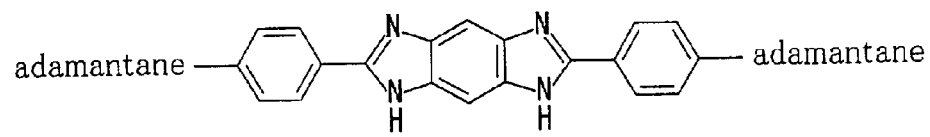
Figure 7:
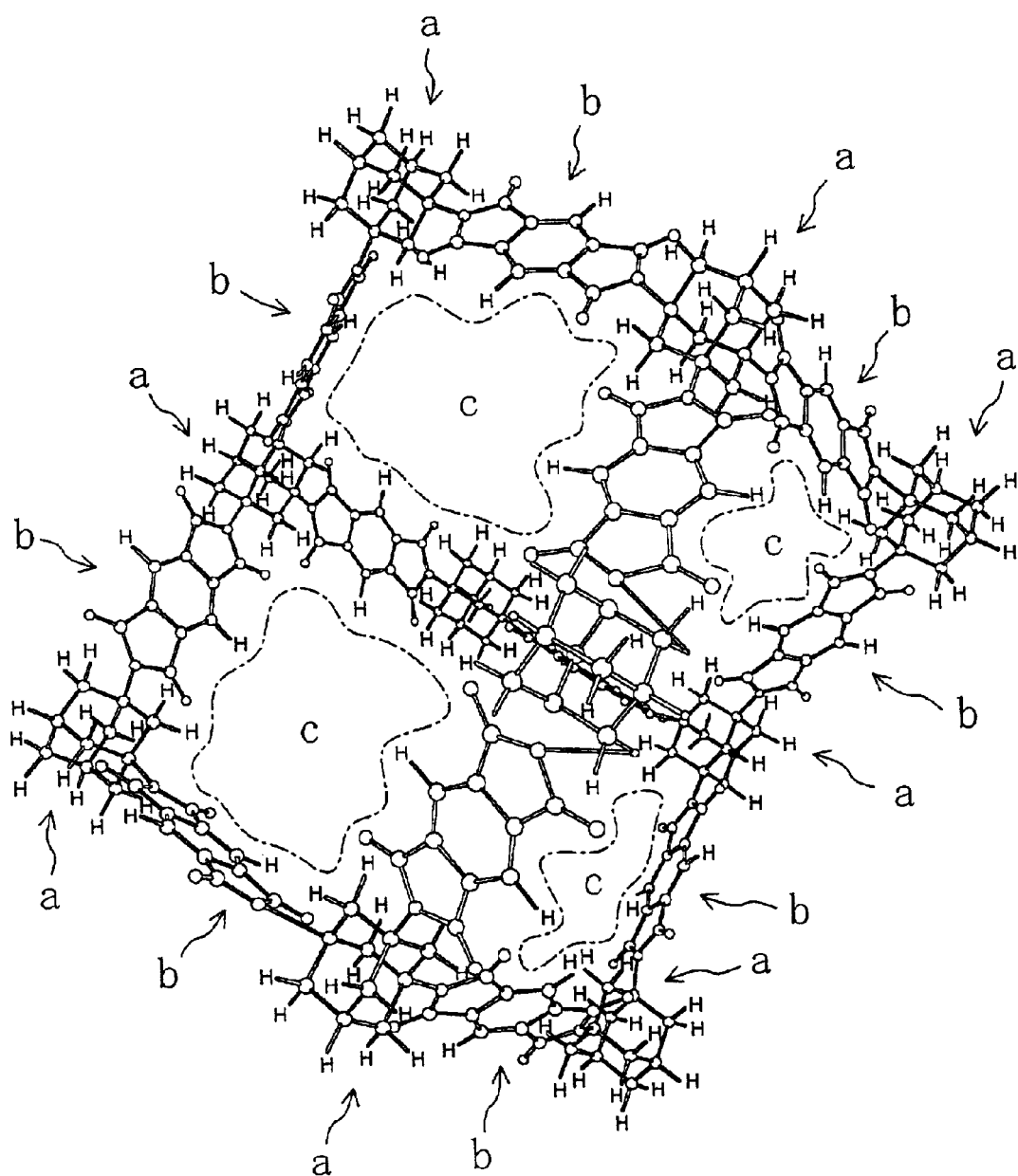
FIG. 7 is a view illustrating a structure of a three-dimensionally polymerized polymer formed in Example 2 of the method for forming an interlayer dielectric film of the first embodiment.

As shown in FIG. 6A, the 1,3,5,7-tetrakis(4-carboxylatophenyl)adamantine (first cross-linking molecule) is copolymerized with tetraaminobenzene (second cross-linking molecule) to form a benzimidazole skeleton as shown in FIG. 6B. As a result, polybenzimidazole is obtained in the form of a network polymerized polymer having a diamond structure as shown in FIG. 7. In FIG. 7, the symbol a indicates 1,3,5,7-tetrakis(4-carboxylatophenyl)adamantine (first cross-linking molecule), b indicates tetraaminobenzene (second cross-linking molecule), and c indicates molecular level pores.

In Example 2, the pores c have a molecular level size and are dispersed uniformly in the network polymerized polymer film. Therefore, the resultant interlayer dielectric film has a significantly low relative dielectric constant.

In addition, since the network polymerized polymer film has a diamond structure, the interlayer dielectric film has a large mechanical strength.

The capacitance of the interlayer dielectric film was measured by a CV method using a mercury prober, and the relative dielectric constant was calculated from the thickness of the interlayer dielectric film. As a result, the relative dielectric constant was 1.7.

The elasticity of the interlayer dielectric film was measured using a nanoindenter, and a value of about 15 GPa was obtained.

In Example 2, as the first cross-linking molecule, 1,3,5, 7-tetrakis(4-carboxylatophenyl)adamantine was used. Alternatively, tetrakis(4-carboxylato)adamantine and the like may be used.

In this example, tetraaminobenzene was used as the second cross-linking molecule to form the benzimidazole skeleton (polybenzimidazole). Alternatively, dihydroxydiaminobenzene may be used in place of tetraaminobenzene, to form a benzoxazole skeleton (polybenzoxazole).

(Second Embodiment)

Hereinafter, the interlayer dielectric film and the method for forming the same of the second embodiment of the present invention will be described with reference to FIGS. 8A and 8B.

Figure 8A:
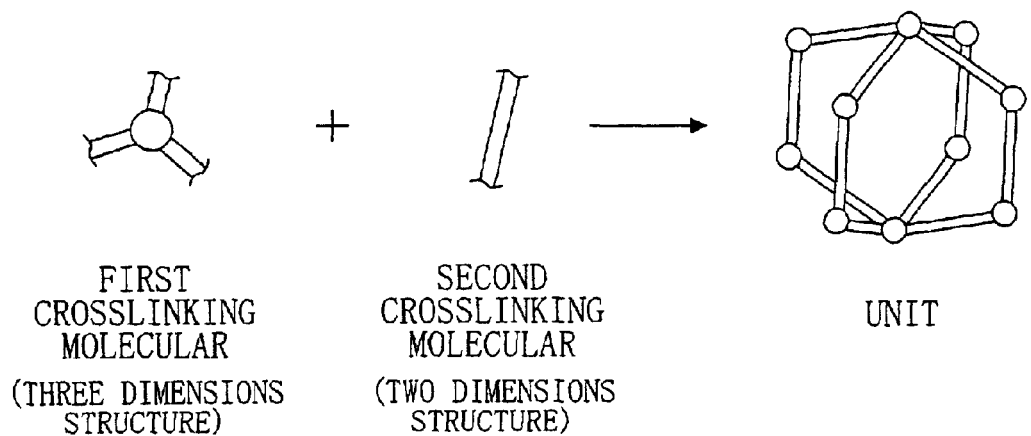
FIGS. 8A and 8B are conceptual views illustrating a method for forming an interlayer dielectric film of the second embodiment of the present invention.

In the second embodiment, as shown in FIG. 8A, one basket-like unit (macromer) is composed of first cross-linking molecules each having three sets of functional groups providing a three-dimensional structure and second cross-linking molecules each having two sets of functional groups providing a two-dimensional structure. Chemical bond is established between the three sets of functional groups of each first cross-linking molecule and the two sets of functional groups of each second cross-linking molecule, to form the unit in which two hexagons share two vertexes with each other. The inside of each basket-like unit constitutes a pore of a molecular size. The set of functional groups as used herein refers to a position composed of one functional group or a plurality of functional groups at which one molecule can be bound with another molecule, as in Example 1, where the number of functional groups in chemical terms does not matter.

Figure 8B:
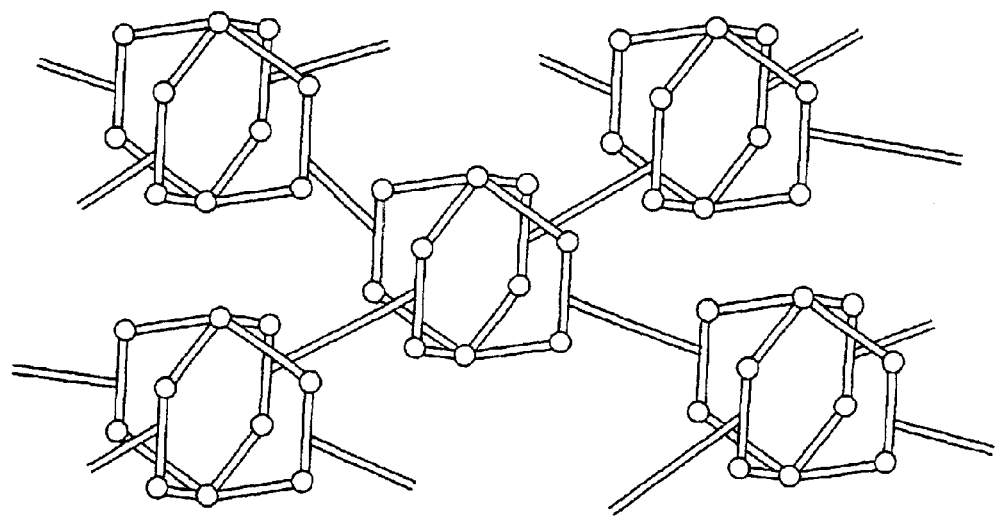

A number of basket-like units having pores inside as shown in FIG. 8A are polymerized through the intermediary of a third cross-linking molecule having a two-dimensional or three-dimensional structure, to form a three-dimensionally polymerized polymer as shown in FIG. 8B, and thus an interlayer dielectric film composed of the three-dimensionally polymerized polymer.

In the second embodiment, a number of units each having a pore are polymerized to form a three-dimensionally polymerized polymer. The three-dimensionally polymerized polymer therefore has a number of pores dispersed inside.

The interlayer dielectric film made of this polymer also has a number of pores dispersed therein, and thus the relative dielectric constant thereof is low.

In the second embodiment, a number of basket-like units each having a pore are polymerized to form a three-dimensionally polymerized polymer. Therefore, it is not necessary to cut cross-linked sites as in the conventional porous film to form a number of pores. The resultant interlayer dielectric film of the second embodiment is high in density of cross-linking compared with the conventional porous film, and thus superior in mechanical strength, thermal resistance, and adhesion to a substrate to the conventional porous film.

The interlayer dielectric film of the second embodiment does not have a diamond structure, unlike that of the first embodiment. Therefore, the mechanical strength in this embodiment is inferior to that in the first embodiment, but still high enough to endure treatments such as metal CMP in an integration process of LSI.

EXAMPLE

An example of the interlayer dielectric film and the formation method thereof of the second embodiment will be described with reference to FIGS. 9A, 9B, 10, and 11.

Figure 9A:
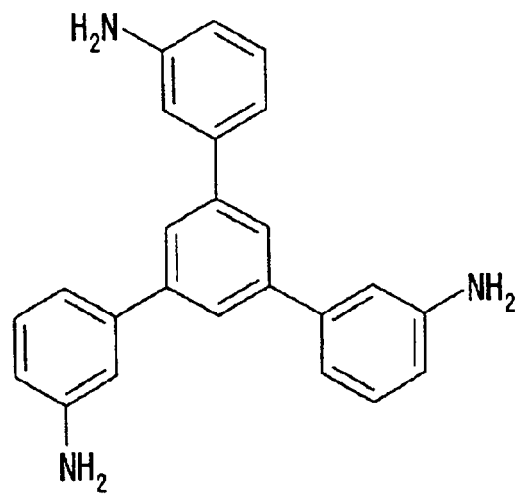
FIG. 9A is a view illustrating a structure of a first cross-linking molecule used in the method for forming an interlayer dielectric film of the second embodiment.
Figure 9B:
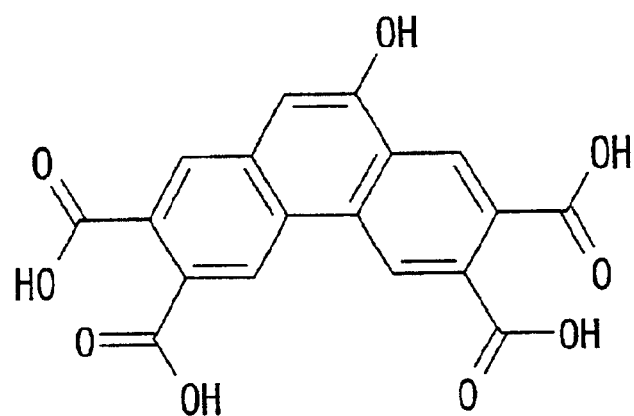
FIG. 9B is a view illustrating a structure of a second cross-linking molecule used in the method for forming an interlayer dielectric film of the second embodiment.

A benzene derivative having three amino groups (hereinafter, referred to as a triphenylbenzene derivative) as shown in FIG. 9A is used as the first cross-linking molecule having three sets of functional groups. A phenanthrene derivative having four carboxyl groups in which a hydroxyl group has been incorporated (hereinafter, referred to as a hydroxyl group containing phenanthrene derivative) as shown in FIG. 9B is used as the second cross-linking molecule having two sets of functional groups.

Figure 10:
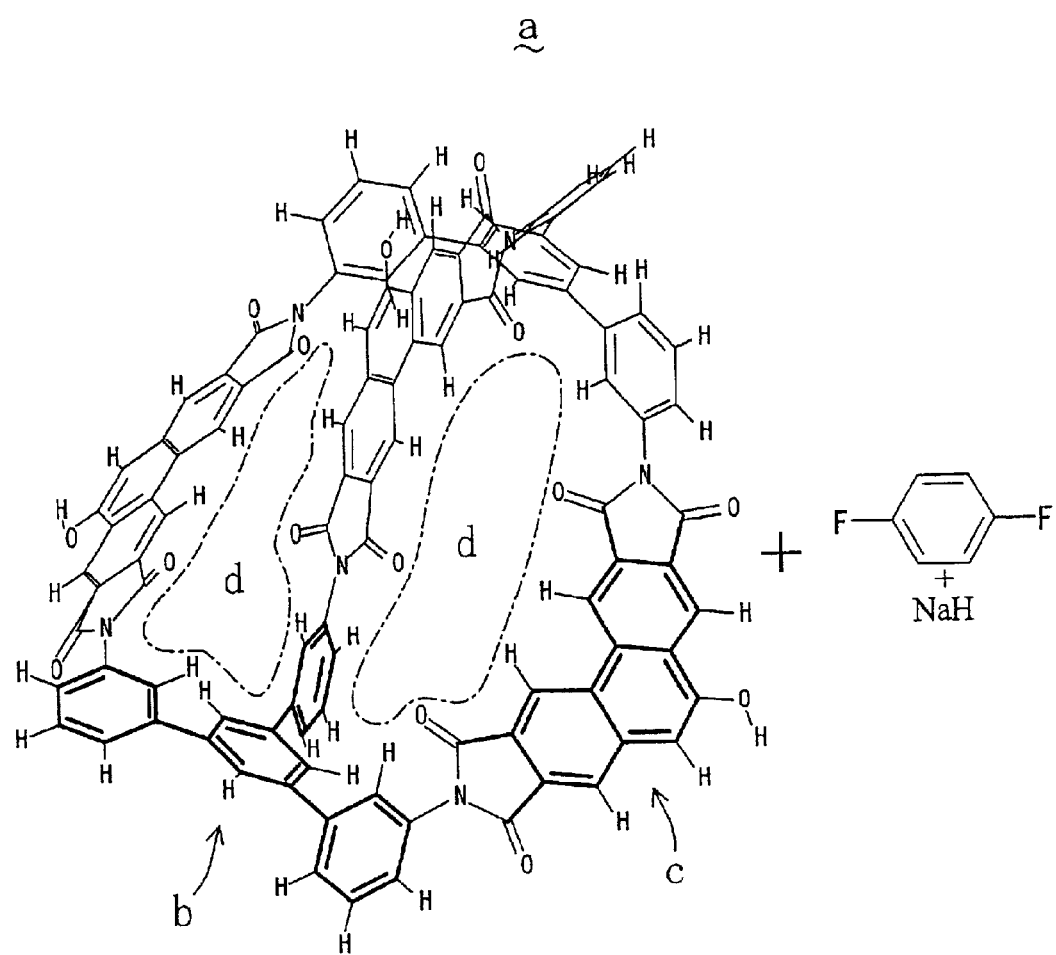
FIG. 10 is a view illustrating a structure of a basket-like unit formed by the method for forming an interlayer dielectric film of the second embodiment.

The triphenylbenzene derivative (first cross-linking molecule) and the hydroxyl group containing phenanthrene derivative (second cross-linking molecule) are allowed to react with each other at a mole fraction of 2:3. By this reaction in which three triphenylbenzene derivatives and two hydroxyl group containing phenanthrene derivatives react with each other, a basket-like unit a as shown in the left half of FIG. 10 is obtained. In FIG. 10, the symbol b indicates the triphenylbenzene derivative, c indicates the hydroxyl group containing phenanthrene, and d indicates the pores formed inside the basket-like unit a.

Figure 11:
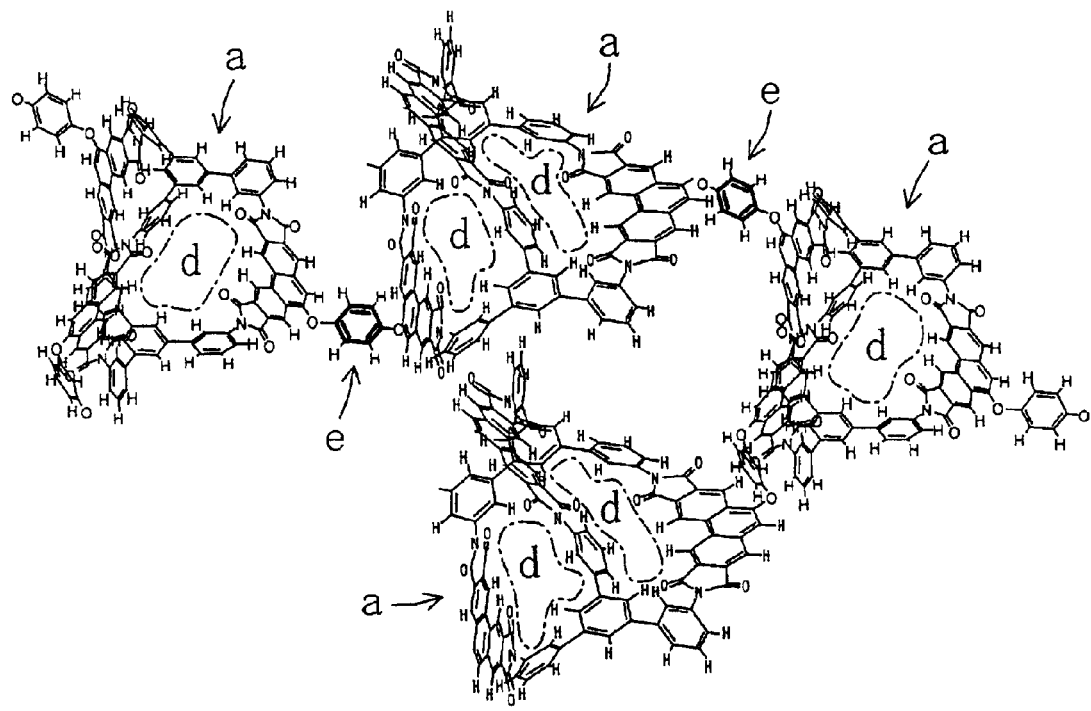
FIG. 11 is a view illustrating a structure of a three-dimensionally polymerized polymer formed by the method for forming an interlayer dielectric film of the second embodiment.

The basket-like units are then cross-linked with difluorobenzene and NaH (sodium hydride) by concomitance, to synthesize a solution of a three-dimensionally polymerized polymer as shown in FIG. 11. In FIG. 11, the symbol a indicates the basket-line units, d indicates the pores, and e indicates benzene rings once included in the difluorobenzene.

Thereafter, the polymer was isolated from the solution and purified. About 15% by weight of the resultant polymer was dissolved in N-methylpyrrolidone, and the dissolved solution, 5 ml, was applied to a silicon substrate during rotation at a rotational speed of 4000 rpm to form an applied film on the silicon substrate. The applied film was dried on a hot plate at a temperature of 250° C., and then heat-treated in a nitrogen atmosphere at a temperature of 400° C. for 30 minutes to sinter the applied film and thereby form an interlayer dielectric film having a thickness of 450 nm.

The capacitance of the interlayer dielectric film was measured by a CV method using a mercury prober, and the relative dielectric constant was calculated from the thickness of the interlayer dielectric film. As a result, the relative dielectric constant was 1.9.

In the Example, the imide formation reaction between an amino group and a carboxylic group and a carboxylic group was employed as the polymerization reaction between the first and the second cross-linking molecules. The reaction is not limited to the above, but reaction systems such as amide bond reaction, ether bond reaction, C—C bond reaction, and C—N bond reaction may be employed.

The ether bond reaction was employed as the polymerization reaction between the basket-like units. The reaction is not limited to the above, but reaction systems such as amide bond reaction, C—C bond reaction, and C—N bond reaction may be employed.

The third cross-linking molecule for cross-linking the first and second cross-linking molecules may have a two-dimensional structure or a three-dimensional structure.

(Third Embodiment)

As the third embodiment, a method for forming an interconnection on the interlayer dielectric film of the first or second embodiment will be described with reference to FIGS. 12A through 12C, 13A, and 13B.

Figure 12A:
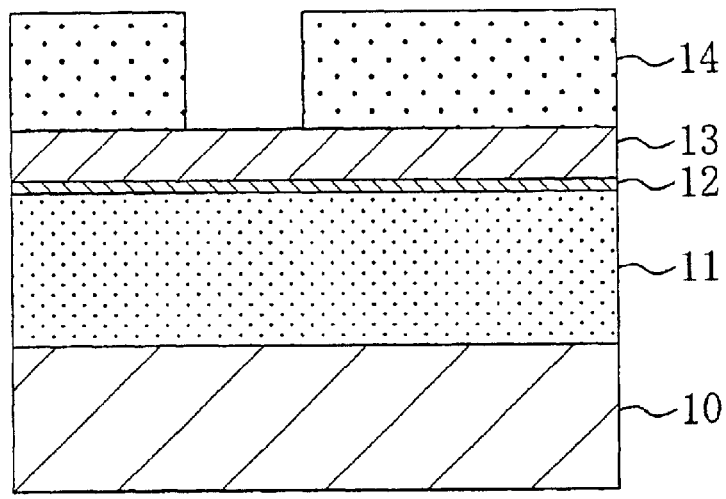
FIGS. 12A through 12C are views illustrating steps of a method for forming an interconnection of the third embodiment.

As shown in FIG. 12A, an interlayer dielectric film 11 having a thickness of 1 μm of the first or second embodiment is formed on a semiconductor substrate 10 having elements such as transistors formed thereon. The resultant substrate is heat-treated in a nitrogen atmosphere at a temperature of 200° C. for three minutes, and then sintered in a nitrogen atmosphere at a temperature of 400° C. for 30 minutes, to cure the interlayer dielectric film 11.

Thereafter, a surface barrier layer 12 made of a polyamide film having a thickness of 10 nm is formed on the interlayer dielectric film 11 by CVD, and a silicon oxide film 13 is formed on the surface barrier layer 12 by CVD. On the silicon oxide film 13, formed is a resist pattern 14 having an opening in an interconnection groove formation region.

Figure 12B:
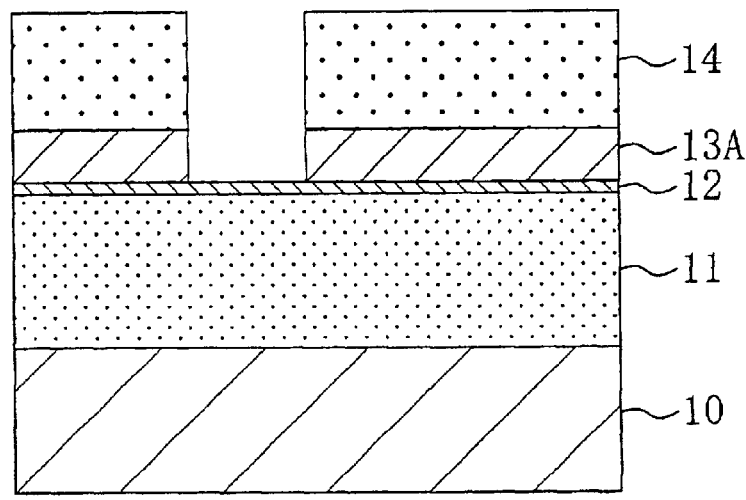

The silicon oxide film 13 is then dry-etched using the resist pattern 14 as a mask, to form a hard mask 13A made of the silicon oxide film 13 as shown in FIG. 12B.

Figure 12C:
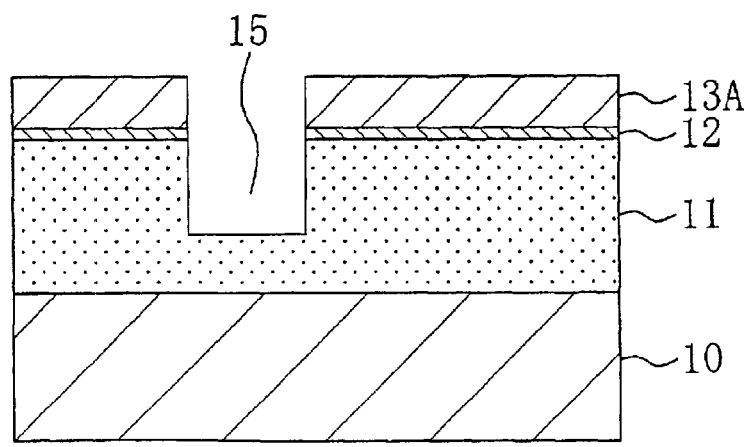

Dry etching is further performed for the surface barrier film 12 and the interlayer dielectric film 11 using the resist pattern 14 and the hard mask 13A as a mask, to form an interconnection groove 15 having a depth of 350 nm as shown in FIG. 12C. The resist pattern 14 is etched away during this dry etching.

Figure 13A:
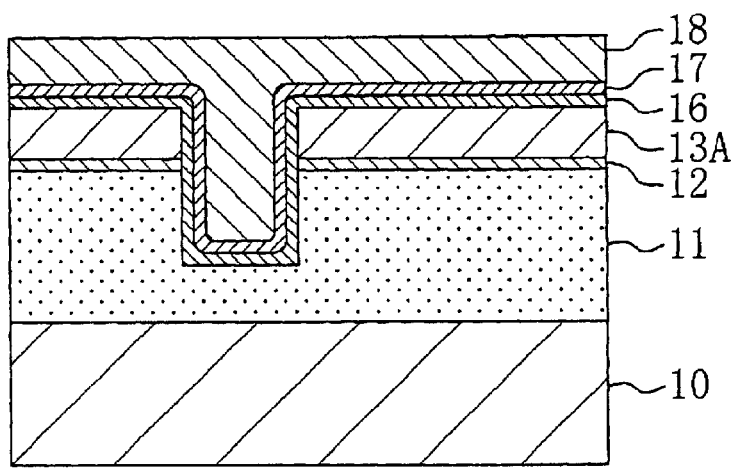
FIGS. 13A and 13B are views illustrating steps of the method for forming an interconnection of the third embodiment.

As shown in FIG. 13A, a sidewall barrier film 16 made of a polyimide film having a thickness of 10 nm is formed on the sidewalls and the bottom surface of the interconnection groove 15 and over the entire surface of the hard mask 13A. On the sidewall barrier film 16, formed is a contact layer 17 made of titanium nitride or tantalum nitride having a thickness of 5 nm by CVD. Thereafter, a copper film 18 having a thickness of 800 nm is formed on the contact layer 17 by plating so as to fill the interconnection groove 15.

Figure 13B:
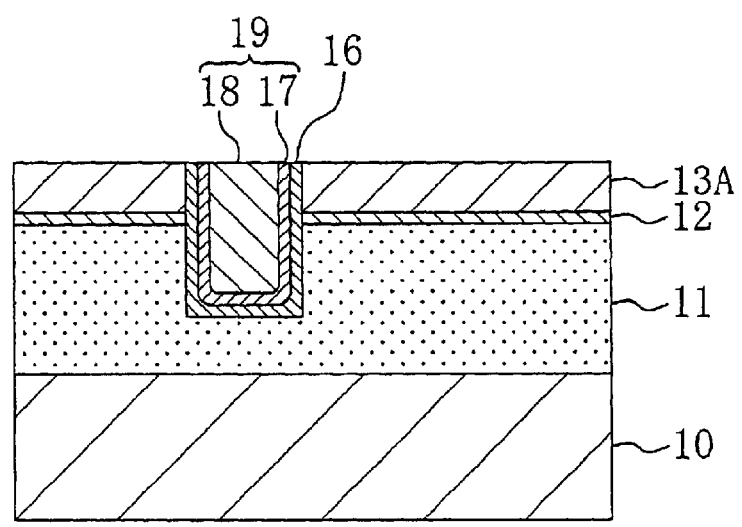

The portions of the copper film 18, the contact layer 17, and the sidewall barrier film 16 that are located above the hard mask 13A are removed by CMP, to form an embedded interconnection 19 as shown in FIG. 13B.

In the third embodiment, the interconnection groove 15 was formed in the surface barrier film 12 and the interlayer dielectric film 11. Alternatively, a contact hole may be formed through the surface barrier film 12 and the interlayer dielectric film 11 to reach the semiconductor substrate 10. Then, the contact hole may be filled with a copper film or an aluminum film to form a contact. When an aluminum film is used, formation of the contact layer 17 may be omitted.

In the third embodiment, the polyimide film was used as the surface barrier film 12 and the sidewall barrier film 16.

It is also possible to use a gas-impermeable film containing an organic material as the main component, such as a diamond-like carbon film formed by CVD or sputtering.

In the third embodiment, the silicon oxide film 13, which is to be used as the hard mask 13A, is formed by CVD after the formation of the surface barrier film 12 on the interlayer dielectric film 11. With the existence of the surface barrier film 12, it is possible to avoid the material gas for formation of the silicon oxide film 13 from entering the pores in the interlayer dielectric film 11 and depositing therein, and thus prevent increase of the relative dielectric constant of the interlayer dielectric film 11. Specifically, when a polyimide film is formed by CVD, clusters of the polyimide, which are larger than the pores in the interlayer dielectric film 11, are deposited on the interlayer dielectric film 11. This prevents the possibility of the material gas entering the pores in the interlayer dielectric film 11.

By using the polyimide film, therefore, the size of the pores of the interlayer dielectric film 11 can be made so large as to otherwise allow the material gas to enter the pores. Thus, the relative dielectric constant of the interlayer dielectric film 11 can be further reduced.

In the third embodiment, the contact layer 17 is formed by CVD after the formation of the sidewall barrier film 16 on the sidewalls and the bottom surface of the interconnection groove 15. With the existence of the sidewall barrier film 16, it is possible to avoid the material gas for formation of the contact layer 17 from entering the pores in the interlayer dielectric film 11 and depositing therein, and thus prevent increase of the relative dielectric constant of the interlayer dielectric film 11.

What is claimed is:

1. A method for forming a semiconductor device, comprising the steps of:

polymerizing a plurality of first cross-linking molecules each having a three-dimensional structure and a plurality of second cross-linking molecules each having a two-dimensional structure to form an interlayer dielectric film composing a three-dimensionally polymerized organic polymer, wherein each first cross-linking molecule comprises a first organic molecule having attached thereto three or more functional groups, and each second cross-linking molecule comprises a second organic molecule having attached thereto two sets of functional groups, and wherein, during polymerizing, a three-dimensional polymerized organic polymer structure having a plurality of molecular level pores is formed by forming a unit with a three-dimensional structure composed of a plurality of polygons having the first cross-linking molecules in each apex and the second cross-linking molecules on each side.

2. The method for forming a semiconductor device film of claim 1, wherein the first organic molecules are represented by

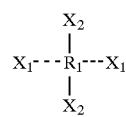

(where $R_1$ is a first organic skeleton, $X_1$ is a first set of functional groups, and $X_2$ is a second set of functional groups, $X_1$ and $X_2$ being same or different in type), the second organic molecules are represented by

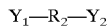

(where $R_2$ is a second organic skeleton, $Y_1$ is a third set of functional groups, and $Y_2$ is a fourth set of functional groups, $Y_1$ and $Y_2$ being same or different in type), and wherein, during polymerization, the three-dimensionally polymerized organic polymer is formed by binding the first set of functional groups ($X_1$) and the third set of functional groups ($Y_1$) together and binding the second set of functional groups ($X_2$) and the fourth set of functional groups ($Y_2$) together, and the molecular level pores are formed in regions surrounded by the first organic skeletons ($R_1$) and the second organic skeletons ($R_2$).

3. The method for forming a semiconductor device of claim 1, wherein the first organic molecules are represented by

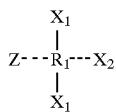

(where $R_1$ is a first organic skeleton, $X_1$ is a first set of functional groups, $X_2$ is a second set of functional groups, and Z is a third set of functional groups, $X_1$ and $X_2$ being same or different in type), the second organic molecules are represented by

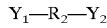

(where $R_2$ is a second organic skeleton, $Y_1$ is a fourth set of functional groups, and $Y_2$ is a fifth set of functional groups, $Y_1$ and $Y_2$ being same or different in type), and wherein, during polymerization, the three-dimensionally polymerized organic polymer is formed by binding the first set of functional groups ($X_1$) and the fourth set of functional groups ($Y_1$) together and binding the second set of functional groups ($X_2$) and the fifth set of functional groups ($Y_2$) together to form a plurality of units and then binding the third set of functional groups (Z) of the plurality of units together, and the molecular level pores are formed in regions surrounded by the first organic skeletons ($R_1$) and the second organic skeletons ($R_2$) in the plurality of units.

4. The method for forming a semiconductor device of claim 1, further comprising the steps of:

forming a surface barrier film on the interlayer dielectric film;

forming a mask on the surface barrier film;

forming a concave portion in the surface barrier film and the interlayer dielectric film by etching the surface barrier film and the interlayer dielectric film using the mask; and forming an interconnection made of a metal material by filling the concave portion with the metal material.

5. The method for forming a semiconductor device of claim 1, further comprising the steps of:

forming a mask on the interlayer dielectric film;

forming a concave portion in the interlayer dielectric film by etching the interlayer dielectric film using the mask;

forming a sidewall barrier film on sidewalls of the concave portion; and forming an interconnection made of a metal material by filling the concave portion having the sidewall barrier film with the metal material.

6. The method for forming a semiconductor device of claim 1, wherein the three-dimensionally polymerized organic polymer has a unit with diamond structure.

7. The method for forming a semiconductor device of claim 1, wherein the three-dimensionally polymerized organic polymer has a basket-like unit.

8. A method for forming a semiconductor device, comprising the steps of:

polymerizing first cross-linking molecules having a three-dimensional structure and second cross-linking molecules having a two-dimensional structure to form an interlayer dielectric film composing a three-dimensionally polymerized organic polymer having a number of molecular level pores, wherein the three-dimensionally polymerized organic polymer has a unit with diamond structure composed of three hexagons sharing two sides with one another.

9. A method for forming a semiconductor device, comprising the steps of:

polymerizing a plurality of first cross-linking molecules each having a three-dimensional structure and a plurality of second cross-linking molecules each having a two-dimensional structure to form an interlayer dielectric film composing a three-dimensionally polymerized organic polymer having a number of molecular level pores, wherein the three-dimensionally polymerized organic polymer has a basket-like unit composed of two hexagons sharing two apexes with one another.

10. A method for forming a semiconductor device, comprising the steps of:

polymerizing a plurality of first cross-linking molecules each having a three-dimensional structure a plurality of and second cross-linking molecules each having a two-dimensional structure to form an interlayer dielectric film composing a three-dimensionally polymerized organic polymer having a number of molecular level pores, wherein the plurality of first cross-linking molecules are adamantine derivatives, and the plurality of second cross-linking molecules are benzene derivatives.

11. A method for forming a semiconductor device, comprising the steps of:

polymerizing a plurality of first cross-linking molecules each having a three-dimensional structure and a plurality of second cross-linking molecules each having a two-dimensional structure to form an interlayer dielectric film composing a three-dimensionally polymerized organic polymer having a number of molecular level pores, wherein the plurality of first cross-linking molecules are benzene derivatives, and the plurality of second cross-linking molecules are phenanthrene derivatives.

12. A method for forming a semiconductor device, comprising the steps of:

polymerizing a plurality of first cross-linking molecules each having a three-dimensional structure and a plurality of second cross-linking molecules each having a two-dimensional structure to form an interlayer dielectric film composing a three-dimensionally polymerized organic polymer having a number of molecular level pores;

wherein the three-dimensionally polymerized organic polymer has a unit with diamond structure composed of three polygons having the first cross-linking molecules in six apexes and sharing three apexes with one another.

13. A method for forming a semiconductor device, comprising the steps of:

polymerizing a plurality of first cross-linking molecules each having a three-dimensional structure and a plurality of second cross-linking molecules each having a two-dimensional structure to form an interlayer dielectric film composing a three-dimensionally polymerized organic polymer having a number of molecular level pores;

wherein the three-dimensionally polymerized organic polymer has a basket-like unit composed of two polygons having the first cross-linking molecules in six apexes and sharing two apexes with one another.

14. A method for forming a semiconductor device, comprising the steps of:

polymerizing a plurality of first cross-linking molecules each having a three-dimensional structure and a plurality of second cross-linking molecules each having a two-dimensional structure to form an interlayer dielectric film composing a three-dimensionally polymerized organic polymer having a number of molecular level pores;

wherein the three-dimensionally polymerized organic polymer has a unit with a three-dimensional structure composed of a plurality of polygons having the first cross-linking molecules in each apex and the second cross-linking molecules on each side.

* * * * *